(12) United States Patent
Rhodes et al.

(10) Patent No.: US 7,830,318 B2
(45) Date of Patent: Nov. 9, 2010

(54) ELECTRICALLY SMALL ANTENNA

(75) Inventors: Mark Rhodes, West Lothian (GB);
Brendan Hyland, Edinburgh (GB)

(73) Assignee: Wireless Fibre Systems, Livingston (GB)

( * ) Notice: Subject to any disclaimer, the term of this patent is extended or adjusted under 35 U.S.C. 154(b) by 429 days.

(21) Appl. No.: 12/112,315

(22) Filed: Apr. 30, 2008

(65) Prior Publication Data

US 2009/0322641 A1 Dec. 31, 2009

Related U.S. Application Data

(60) Provisional application No. 61/014,793, filed on Dec. 19, 2007.

(30) Foreign Application Priority Data

Dec. 19, 2007 (GB) .................................. 0724702.6

(51) Int. Cl.
*H01Q 1/34* (2006.01)
(52) U.S. Cl. ...................................... 343/710; 343/709
(58) Field of Classification Search ................ 343/709, 343/710, 810, 741, 742, 793
See application file for complete search history.

(56) References Cited

U.S. PATENT DOCUMENTS

| 3,152,321 | A  | * | 10/1964 | Peltzer ........................ 365/152 |
| 6,717,283 | B2 | * | 4/2004 | Skinner et al. ................ 290/43 |
| 7,647,979 | B2 | * | 1/2010 | Shipley et al. ............... 166/381 |

* cited by examiner

*Primary Examiner*—HoangAnh T Le
(74) *Attorney, Agent, or Firm*—Paul Davis; Goodwin Procter LLP

(57) ABSTRACT

An antenna system, with a loop antenna and a loop current, is provided for transmitting an electromagnetic signal through a medium. The loop antenna has an E field transducer that generates an E field, and an H field transducer that generates an H field. The E and H fields are orthogonal in space and have at least one of a magnitude and phase relationship that is matched to an intrinsic impedance of a medium to generate a propagating wave. In an insulating medium the loop current lags an E field plate voltage by 90° to produce in phase E and H fields. In a conductive medium current is applied to the loop with a 135° phase lag with respect to a voltage across the E field plates. The H field is generated by the current component and leads current by 90°.

22 Claims, 9 Drawing Sheets

ELECTRICALLY SMALL ANTENNA

CROSS-REFERENCE TO RELATED APPLICATIONS

This application claims the benefit of UK application GB0724702.6 filed Dec. 19, 2007 and U.S. Ser. No. 61/014,793 filed Dec. 19, 2007, both of which applications are incorporated herein by reference.

BACKGROUND OF THE INVENTION

1. Field of the Invention

This invention relates generally to electrically small antenna, and more particularly to electrically small antenna systems suitable for waves propagating through water.

2. Description of the Related Art

Electrically large antennas with dimensions of a fraction of a wavelength are well known for efficient launch and reception of electromagnetic signals. The half wave dipole and quarter wave antenna are typical examples. However, in some instances, particularly in low frequency and portable applications, the dimensions of a wavelength related antenna become impractical.

Underwater radio applications differ from through air communications primarily due to the conductive nature of the medium. Seawater has a higher ionic salt content than fresh water hence much higher conductivity. In the radio spectrum, attenuation of electromagnetic signals increases rapidly with frequency. Relatively low signal frequencies (1 Hz to 10 MHz) are commonly employed in communication systems underwater in order to reduce signal attenuation as much as possible.

The wavelength of a propagating wave is greatly shortened in a partially conductive medium compared to air or free space. For example, at 1 kHz the free space wavelength is 300 km while in seawater this is reduced to 50 m. However, these are still impracticably large dimensions for the wavelength related antennas conventionally used in through-air radio systems. In the past, portable underwater radio systems have used loop antennas that are small compared to their operating wavelength. These loops approximate to a magnetic dipole.

A magnetic loop carrying an alternating current produces three distinct field components. In addition to conductive attenuation, each term has a different geometric loss as we move distance r from the launching loop. An inductive term varies with a coefficient that includes a $1/r^3$ term, a quasi-static term by $1/r^2$ and a propagating wave by $1/r$. In designing a communicating system it is preferable to maximise the propagating $1/r$ component since this dissipates at the lowest rate of the three terms. Equivalent distance varying terms exist for an electric field source.

In the magnetic dipole every element of the loop has a corresponding element at the other side of the loop with current flowing in the opposite direction. In the limit of a loop radius, which is a fraction of a wavelength, propagating waves emitted by these elements are in opposing phase, so exactly cancel and no $1/r$ propagating term is launched. Electrically small loop antennas are therefore intrinsically poor generators or receivers of propagating radio waves.

There is a general need for an electrically small antenna which optimises launch of the propagating field component to improve antenna efficiency and achievable range. This is of particular interest for underwater radio applications.

SUMMARY OF THE INVENTION

Accordingly, an object of the present invention is to provide improved electrically small antennas.

Another object of the present invention is to provide electrically small antenna systems wherein a propagating electromagnetic wave is synthesised through controlled combination of E and H field generated by independent E and H transducers.

A further object of the present invention is to provide electrically small antenna systems where the phase and amplitude relationship between the E and H field is adjusted to match the intrinsic impedance of the propagation medium.

Yet another object of the present invention is to provide electrically small antenna systems suitable for underwater use.

Another object of the present invention is to provide electrically small antenna systems suitable for use underwater, and the E and H fields are combined such that they have a magnitude and/or phase relationship that is matched to the intrinsic impedance of the water.

These and other objects of the present invention are achieved in, an antenna system for transmitting an electromagnetic signal through a medium. A loop antenna is provided with a loop current. The loop antenna has an E field transducer that generates an E field, and an H field transducer that generates an H field. The E and H fields are orthogonal in space and have at least one of a magnitude and phase relationship that is matched to an intrinsic impedance of a medium to generate a propagating wave. In an insulating medium the loop current lags an E field plate voltage by 90° to produce in phase E and H fields. In a conductive medium current is applied to the loop with a 135° phase lag with respect to a voltage across the E field plates. The H field is generated by the current component and leads current by 90°.

DETAILED DESCRIPTION OF THE PREFERRED EMBODIMENTS

Figure 1:
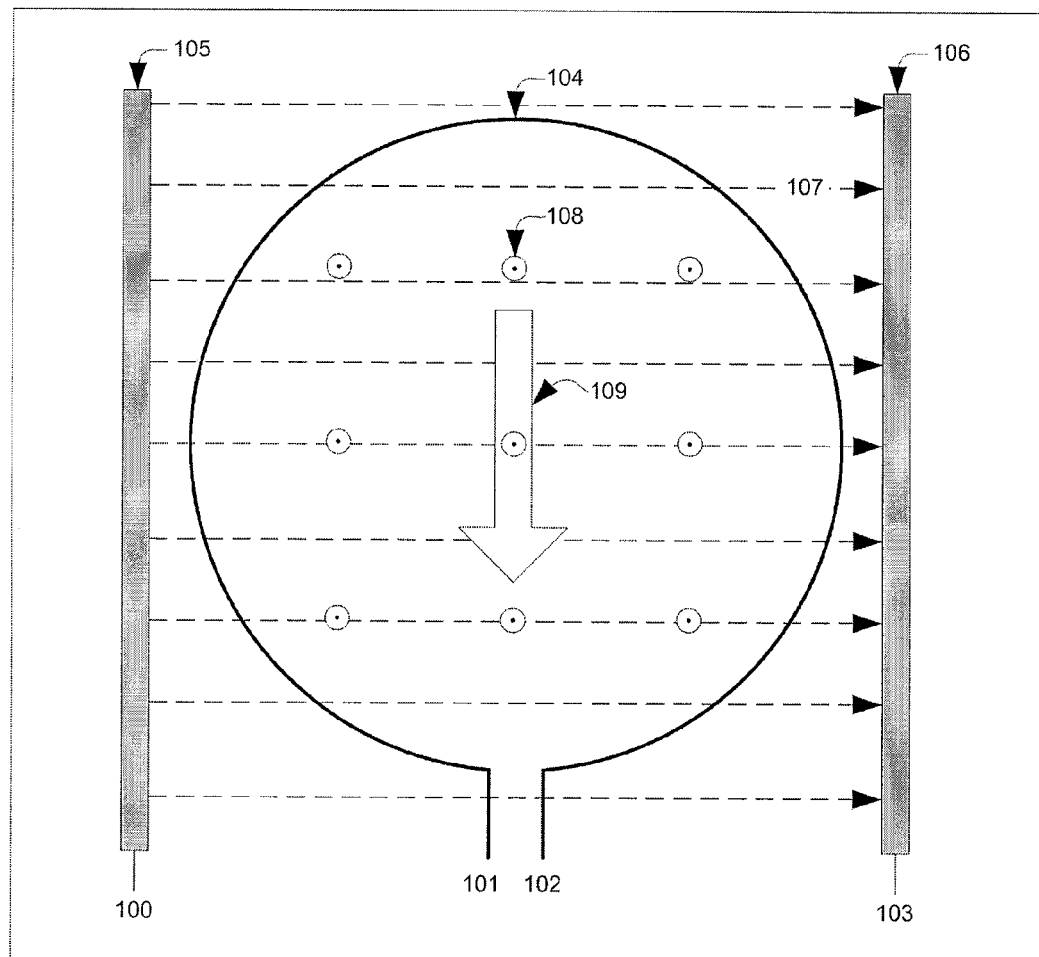
FIG. 1 is a plan view illustrating one embodiment of a combined magnetic dipole and parallel plate structure of the present invention.

In one embodiment, the present invention is an antenna system that synthesizes a propagating wave by controlled combination of independent E and H field transducers to match the natural E-H relationship given by the medium's intrinsic impedance. While the time-phase relationship between E and H field is 0° for a propagating wave in air, the phase angle and relative magnitude changes for different propagation media. To achieve optimum efficiency, and in accordance with the invention, the relative phase and magnitude of the generated E and H fields are controlled to match the intrinsic impedance of the medium and hence preferentially launch a propagating wave at the antenna. This is particularly useful in underwater radio applications where the frequency dependence of radio attenuation leads to operation at very low radio frequencies where wavelength related antenna designs become impracticably large.

The antenna system of the present invention can act to receive propagating electromagnetic waves by controlled phase combination of signals received by independent E and H transducers. In one embodiment, the magnetic field transducer is a magnetic dipole formed by at least one circular turn of wire carrying a time varying current wherein the loop radius is significantly less than the operable wavelength.

In one embodiment, the antenna system of the present invention is used underwater and the E and H fields are combined such that they have a magnitude and/or phase relationship that is matched to the intrinsic impedance of the water.

The E field transducer can have a pair of parallel conducting plates. The parallel plates can be arranged either side of the H field transducer. Multiple pairs of parallel plates can be provided. Each plate can be driven with an in-phase voltage referenced to the adjacent plate that creates a constant E field vector across the loop. Each adjacent pair can be driven with anti-phase voltage. The multiple parallel plates can be equally spaced. The multiple parallel plates can be alternately closely and widely spaced. At least one pair of parallel plates can be within the H field transducer. The E field transducer can be covered by an electrically insulating material.

The electric field of the E field transducer can be about uniform in magnitude and direction. The E field transducer can be parallel plates and the electric field be approximately uniform in magnitude and direction in the region between the plates. In one embodiment, the E-field transducer is a pair of conducting plates arranged either side of a Helmholtz coil magnetic transducer, with a dimension of at least twice the loop radius in the direction of the loop plane and at least equal to the loop radius in the direction of loop separation, and positioned to generate a substantially uniform E field throughout the volume bounded by the two loops.

In one embodiment, the H field transducer is at least one magnetic dipole. At least two magnetic dipoles can be provided in a Helmholtz coil arrangement. Multiple dipoles can be provided, each operable to be independently driven. The H field transducer can be an open cored solenoid. In one embodiment, the magnetic field of the H field transducer is approximately uniform in magnitude and direction throughout its volume. When the H field transducer is one or more loops, the volume is defined by the loop or loops.

In one embodiment, a device is provided for measuring the propagation medium conductivity and adjusting the magnitude and/or phase relationship between the E and H field in response to the measured conductivity.

Propagating electromagnetic waves constantly exchange energy between electric and magnetic field components. The magnitude and phase relationship between the E and H field components can be described in terms of the intrinsic impedance of the medium. The intrinsic impedance of free space is purely resistive at 377 Ohms. In most of the propagation media of interest, for example air and water, the relative permeability is unity so intrinsic impedance is largely a function of conductivity. Water is a partially electrically conductive medium and its intrinsic impedance is inductive with a strong dependence on conductivity.

In the physics of electromagnetic propagation a good conductor is defined as:

$$\sigma/(\epsilon_o \epsilon_r \omega) > 100 \qquad (1)$$

where:

$\sigma$=conductivity, for sea water=4 S/m $\epsilon_o$=permittivity of free space=8.8541878176×10-12 F/m $\epsilon_r$=relative permittivity, sea water=80

$\omega$=angular frequency

For typical sea water at 1 kHz this measure of conductivity is 9×10⁵, which falls well within the definition of a good conductor. The intrinsic impedance of seawater can be represented as:

$$Z = \frac{1+j}{e^{2w}} \frac{\mu\omega}{\sigma} \qquad (2)$$

where:

Z=intrinsic impedance $\mu$=permeability in N·A⁻²

$\omega$=angular frequency in radians/s $\sigma$=conductivity in S/m

For a good conductor such as seawater, E and H vectors are of equal magnitude and the phase angle is 45°.

In one embodiment, the antenna system of the present invention co-locates a parallel plate transducer for E field generation and a loop or solenoid for H field to preferentially launch a propagating wave, which shows lower geometric losses i.e. 1/r term, compared to the inductive and quasi-static terms which dominate when an electrically small loop is used alone. In one embodiment, the H field can be generated using a Helmholtz coil.

A Helmholtz coil arrangement has two equal diameter multi-turn loops in parallel planes with centres aligned and spaced by a distance equal to their radius. Current is arranged to flow in the two coils in phase synchronization and the magnetic field is approximately uniform in magnitude and direction throughout the volume defined by the two offset loops. Parallel plates arranged perpendicular to the loop planes create an electric field that is approximately uniform in magnitude and direction throughout the volume defined by the two offset loops. This arrangement has the advantage of generating a large volume of space where the E and H vectors can be arranged to be orthogonal and their phase relationship precisely controlled. This volume efficiently synthesizes a propagating wave.

The magnetic flux density at the centre point of a Helmholtz coil in air is given by equation 1:

$$B = \left(\frac{4}{5}\right)^{3/2} \frac{\mu_0 n I}{R} \quad (1)$$

Where:

R=coil radius n=number of turns in each coil $\mu_0$=permeability of free space

I=current flowing through the coils

FIG. 1 illustrates a plan view of a combined magnetic dipole and parallel plate structure. Loop 104 represents the top loop of a Helmholtz coil pairing. An alternating current is supplied through terminals 101 and 102. The diagram represents an instant in time where the generated magnetic flux is orthogonal to the page as illustrated by symbol 108 and the 8 identical symbols. Plates 105 and 106 represent conducting plates arranged to be perpendicular to the plain of the coils. An alternating potential is applied across terminals 100 and 103 generating an E field as indicated by arrows 107 that is orthogonal to the magnetic flux 108. Arrow 109 shows the direction of the generated propagating wave. The mechanical arrangement of loops and plates ensures E and H fields are launched with the correct spatial orientation to form a propagating wave with E and H fields in orthogonal directions. The antenna radiation gain will show a maximum in the direction of arrow 109 shown in FIG. 1.

Figure 2:
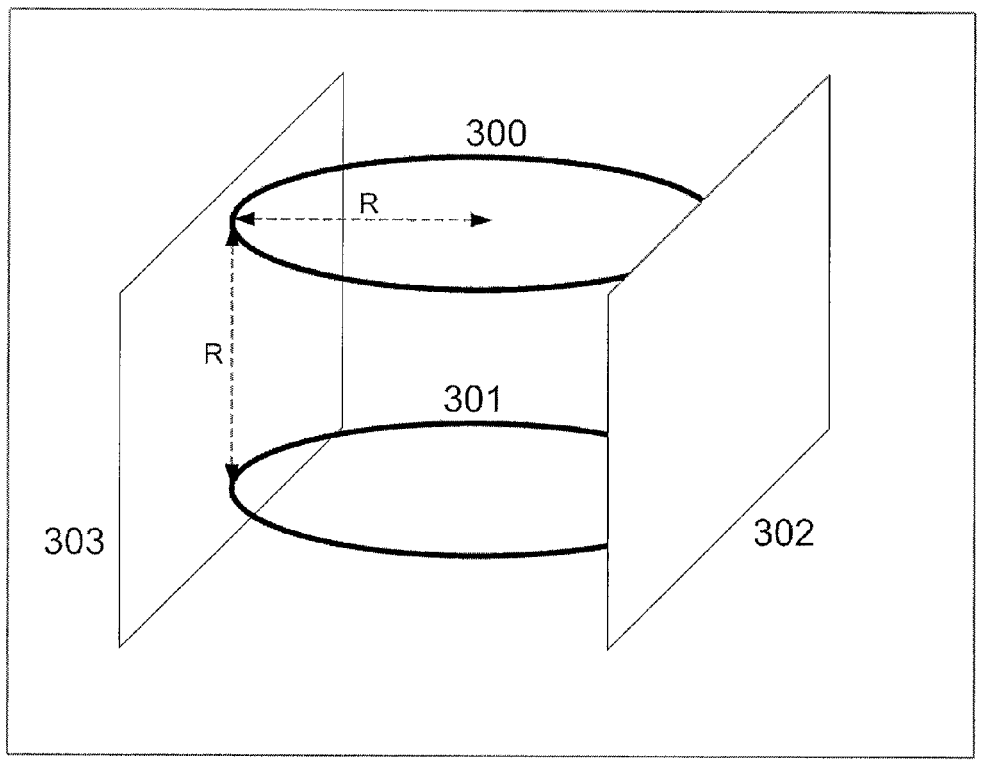
FIG. 2 is a perspective view illustrating one embodiment of a Helmholtz coil and parallel plate antenna implementation of the present invention.

FIG. 2 illustrates a perspective view of a Helmholtz coil and parallel plate antenna implementation. Coils 300 and 301 are arranged in parallel alignment and separated by a distance equal to their radius. Both coils are driven to produce in phase alternating currents. Plates 302 and 303 are driven with an alternating potential which has the required magnitude and phase relationship with the loop current to produce the desired E and H relationship to efficiently launch a propagating wave.

Figure 3:
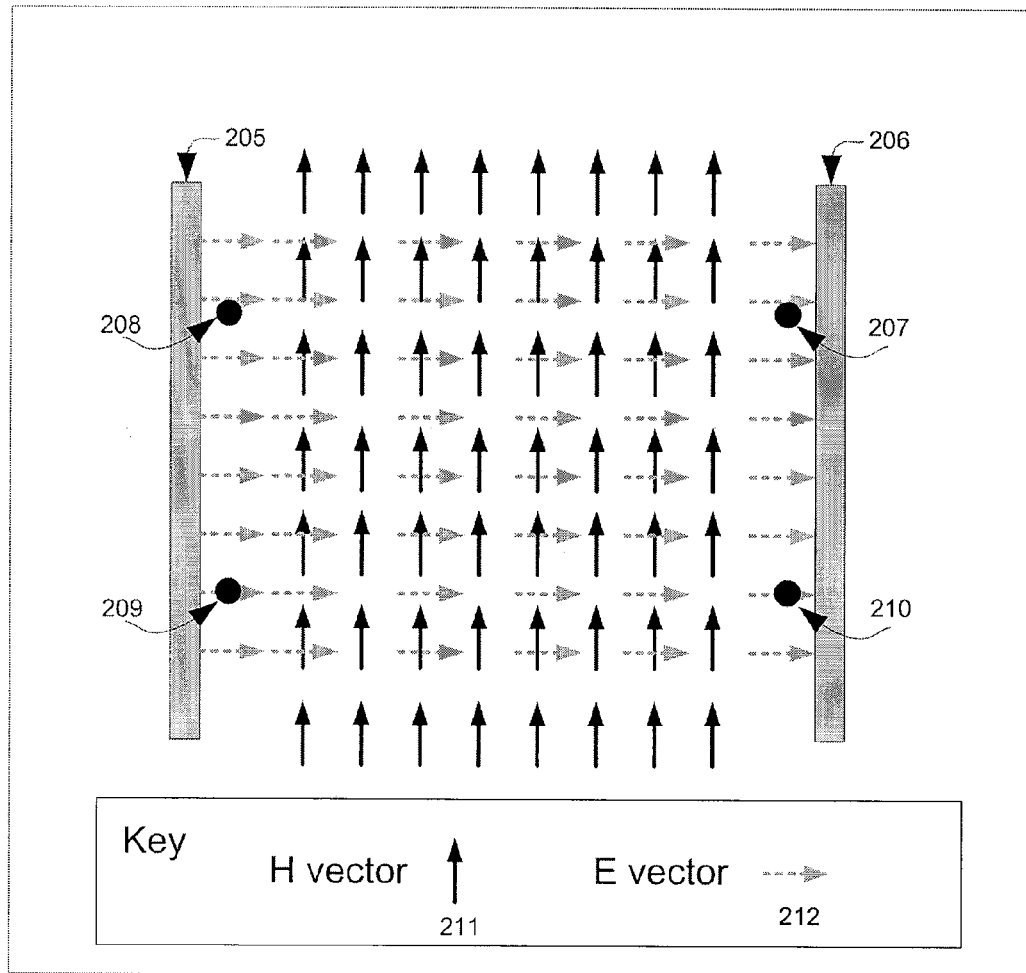
FIG. 3 is a representation of the H field and E field vectors on a plane passing through the centre of a Helmholtz coil of an embodiment of the present invention.

Referring now to FIG. 3, a representation of the H field and E field vectors on a plane is shown passing through the centre of a Helmholtz coil. Conductors 207 and 208 represent a cross section through the centre of the top coil in the Helmholtz coil arrangement as illustrated. 209 and 210 represent a cross section through the conductors of the lower coil. The coils produce an almost uniform magnetic field within the three-dimensional volume defined by the two loops as illustrated by the black vertical arrows 211. Plates 205 and 206 generate an almost uniform electric field within the same volume as illustrated by the grey arrows 212 and this field is orthogonal to the H field vectors.

Figure 4:
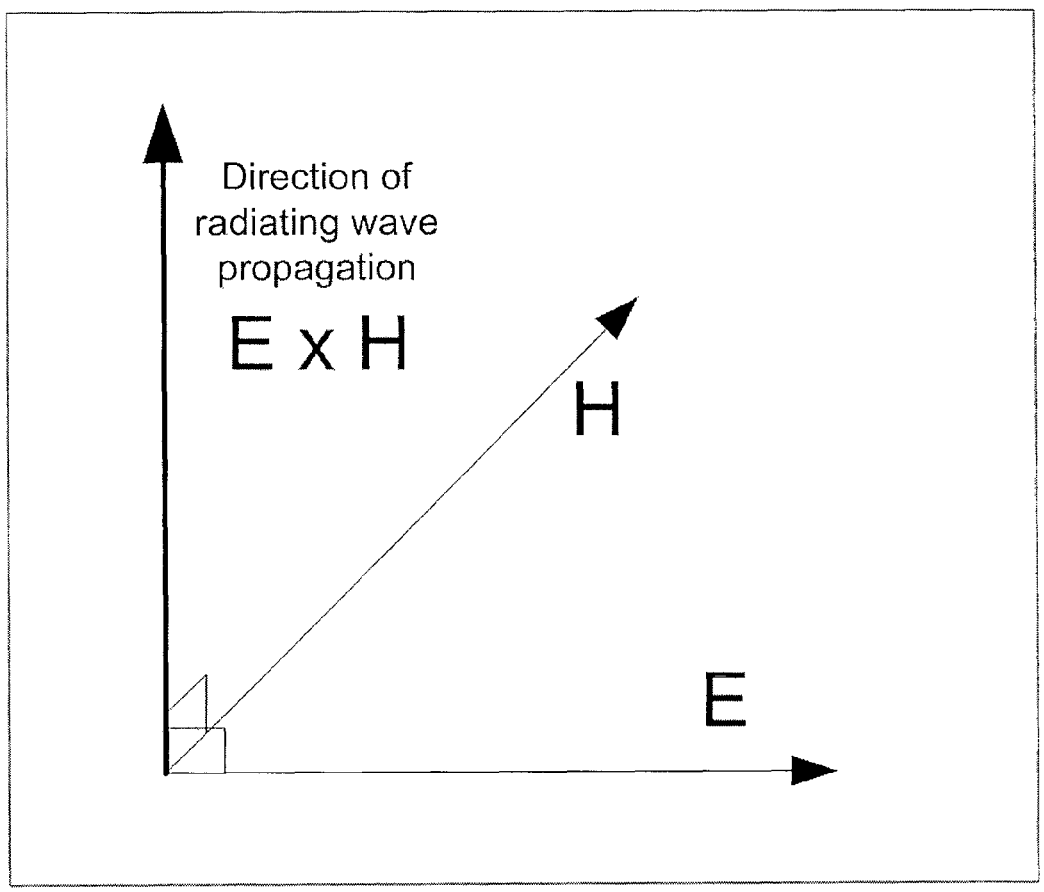
FIG. 4 is a Poynting vector indicating the direction of power flow in a propagating wave resulting from the illustrated E and H fields of an embodiment of the present invention.

As shown in FIG. 4, the Poynting vector that indicates the direction of power flow in a propagating wave resulting from the illustrated E and H fields. The Poynting vector is the scaled vector cross product of E and H and gives the direction and magnitude of energy flow.

In one embodiment of the present invention, the control of the E-H phase relationship is a key component. Current in a magnetic loop lags H field phase by 90° while voltage in the E field transducer is in phase with the resulting E field. These two largely independent structures can be fed with the correct phase relationship between loop current and E field transducer voltage to produce E and H fields that correspond to the intrinsic impedance of the medium. When operated in air or other insulating medium, loop current must lag E field plate voltage by 90° to produce in phase E and H field.

For operation in a conductive medium, including but not limited to sea water, current is applied to the loop with a 135° phase lag with respect to the Voltage across the E field plates. The H field is generated by the current component and leads current by 90°. Supply of current at −135° phase relationship to Voltage results in E and H fields launches with H lagging E field by 45°. This phase relationship matches the intrinsic impedance of seawater so optimising the generation of propagating electromagnetic waves from the antenna structure. For materials whose conductivity lies somewhere between an insulator and a good conductor, it will be necessary to modify the phase relationship between E and H field to match the material's characteristic impedance.

Figure 5:
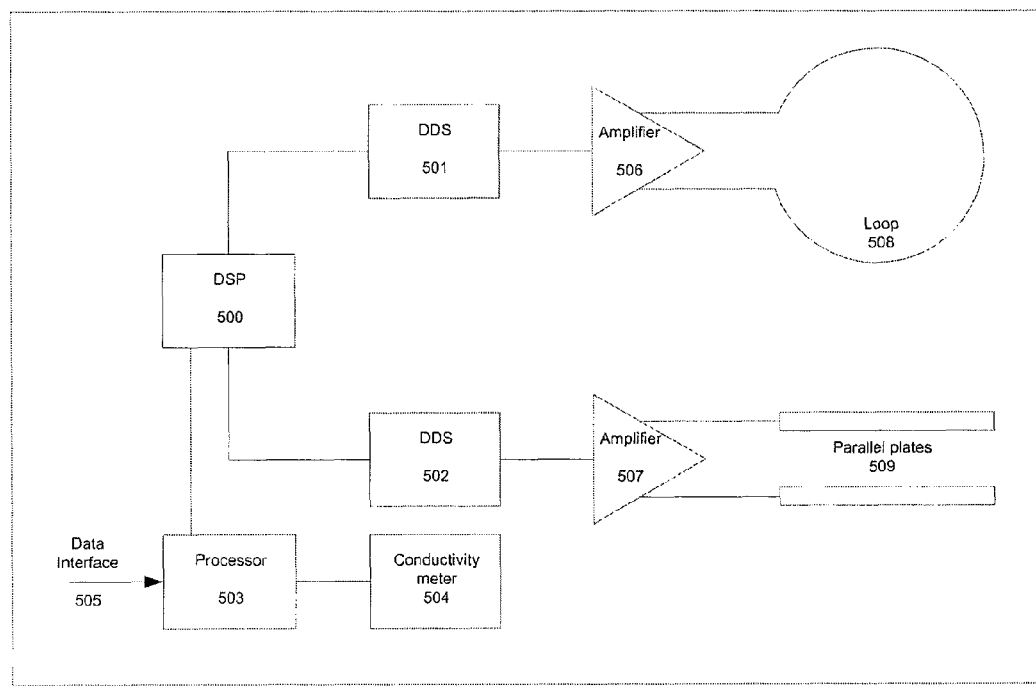
FIG. 5 is a block diagram illustrating one embodiment of a transmitter system implementation for use with an E-H antenna of the present invention.

In one embodiment, a method for implementing the required adjustable phase relationship between magnetic loop current and parallel plate voltage is illustrated in FIG. 5. FIG. 5 illustrates a block diagram of an example transmitter system implementation for use with the present E-H antenna. Data interface 505 connects to client equipment that can be a source of communications data, sensing data or any general data source. Processor 503 formats the data and interfaces to a Digital Signal Processor (DSP) 500. The DSP generates a digital representation of a modulated carrier signal representing the digital data.

DSP 500 interfaces to Direct Digital Synthesizer (DDS) 501, which synthesizes an analogue modulated waveform for amplification by amplifier 506, which drives a current through magnetic loop transducer 508. DSP 500 also supplies a phase-shifted version of the digital modulated signal to DDS 502, which generates an analogue signal that is passed to amplifier 507, which generates a potential across parallel plates 509. Processor 503 also interfaces to conductivity meter 504, which provides a measurement of the propagation medium conductivity. Processor 503 uses measured conductivity as a basis for calculation of the required phase offset between loop current and parallel plate potential.

A general principle of reciprocity can apply to the antenna system design of the present invention. While the above description has been given in terms of a transmitter design the principles described are equally applicable to a receive antenna system. When the antenna structure is used as a receiver an alternating voltage is induced in the parallel plates and a current induced in the magnetic loop. These signals must be detected and combined with the correct phase relationship again adjusted for the corresponding propagating medium's intrinsic impedance.

Figure 6:
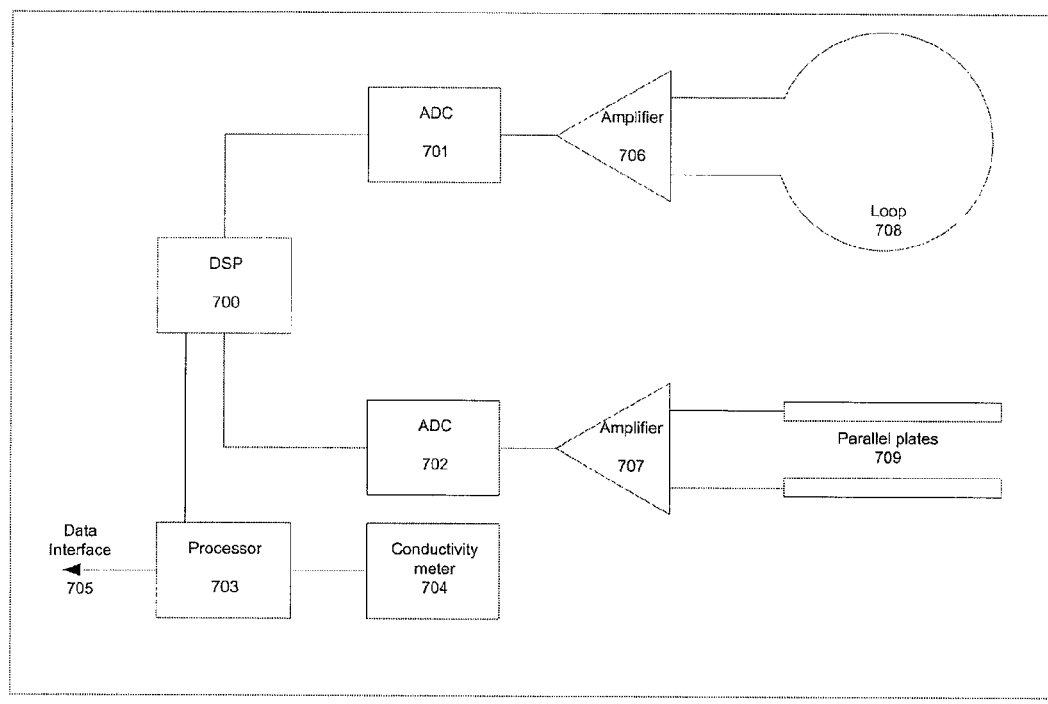
FIG. 6 is a block diagram illustrating one embodiment of a receiver system implementation for use with an E-H antenna of the present invention.

FIG. 6 illustrates a block diagram of a receiver system example implementation for use with one embodiment of the E-H antenna. Current induced in loop 708 by an incident propagating electromagnetic wave is amplified 706 and digitised by Analogue to Digital Converter (ADC) 701. The digitised representation is passed to DSP 700. The incident propagating electromagnetic wave also induces a potential across parallel plates 709. This potential is amplified 707 and digitised by ADC 702. Digitised data is passed to DSP 700 where it is combined with a phase-shifted version of the digitised loop current. The DSP downconverts the combined signal and extracts de-modulated data that is passed to processor 703 which formats the data stream and passes the data to external data interface 705 for use by a client system. Processor 703 also interfaces to conductivity meter 704, which provides a measurement of the propagation medium conductivity. Processor 703 uses measured conductivity as a basis for calculation of the required phase offset between loop current and parallel plate potential digitised signals.

While the system described above uses a Helmholtz coil arrangement with parallel plates providing an electric field, these implementation details are provided by way of illustration only. Any electrically small magnetic loop or solenoid, including but not limited to, an open cored solenoid or high permeability, low conductivity (Ferrite) cored solenoid, or combination of multiple loops or solenoids can be used to generate the magnetic field. In particular, the antenna system of the present invention can include a single turn loop that has a small circumference compared to wavelength in the propagating medium, by way of non-limiting example<$\frac{1}{5}^{th}$ wavelength, or a multiple turn loop where the total wire length is electrically small compared to wavelength in the propagating medium, by way of non-limiting example<$\frac{1}{5}^{th}$ wavelength. Furthermore, any suitable arrangement can be used to produce an electric field orthogonal to the magnetic field. The relative phase and magnitude of the independent magnetic and electric field can be controlled to correspond to the intrinsic impedance of the propagation medium.

Figure 7:
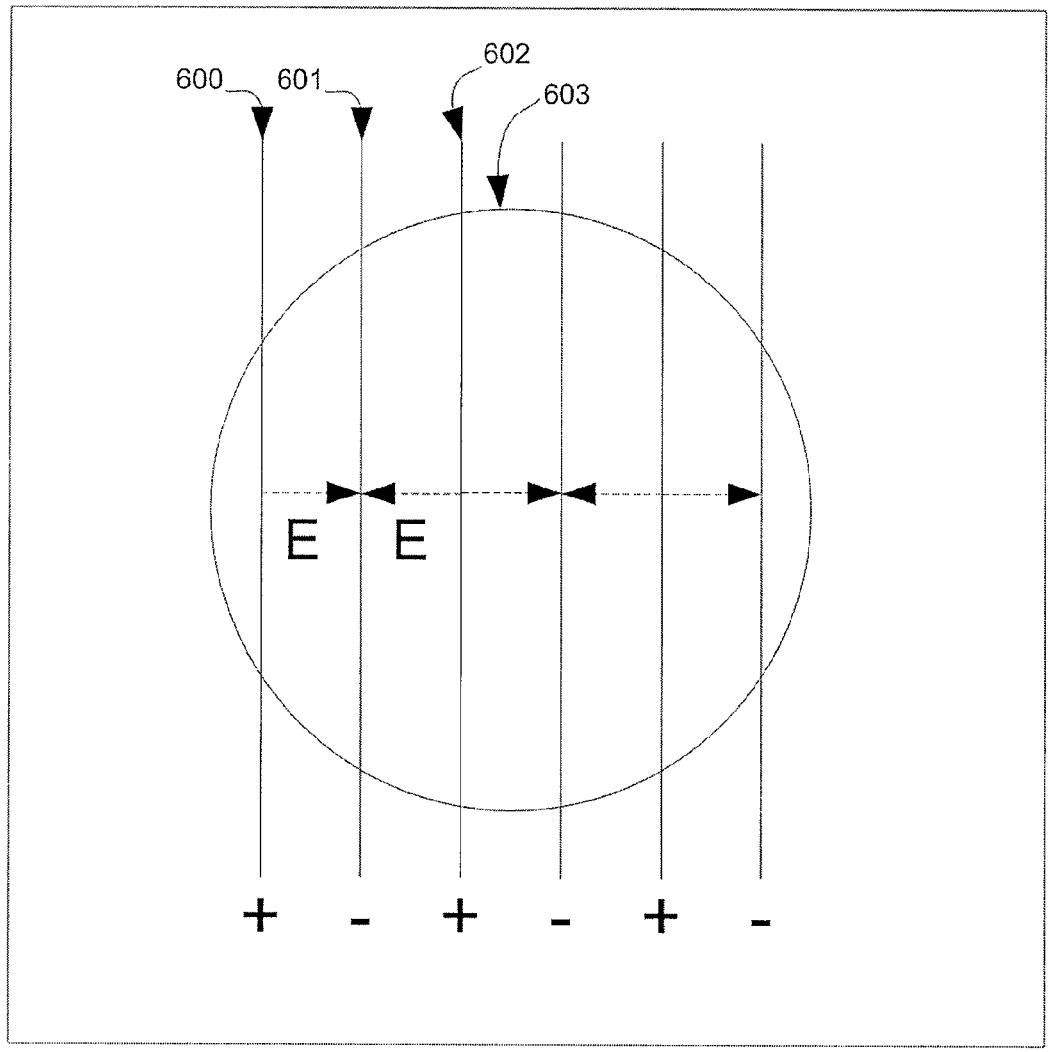
FIG. 7 illustrates one embodiment of a multi-plate electrode design of the present invention.

Multiple parallel plates can be used to reduce the maximum potential required. As separation is decreased, a proportionately smaller voltage is required to produce a given electric field. FIG. 7 illustrates an arrangement of multiple parallel plates 600 arranged across the diameter of a magnetic loop 603. Alternate plates are driven in anti-phase to produce the required potential difference. The region between plates 600 and 601 produce a propagating wave travelling toward the bottom of the page. The region between plates 601 and 602 produces a wave propagating to the top of the page. This design can produce antenna gain in both directions and in some applications this will be a desirable feature.

Figure 8:
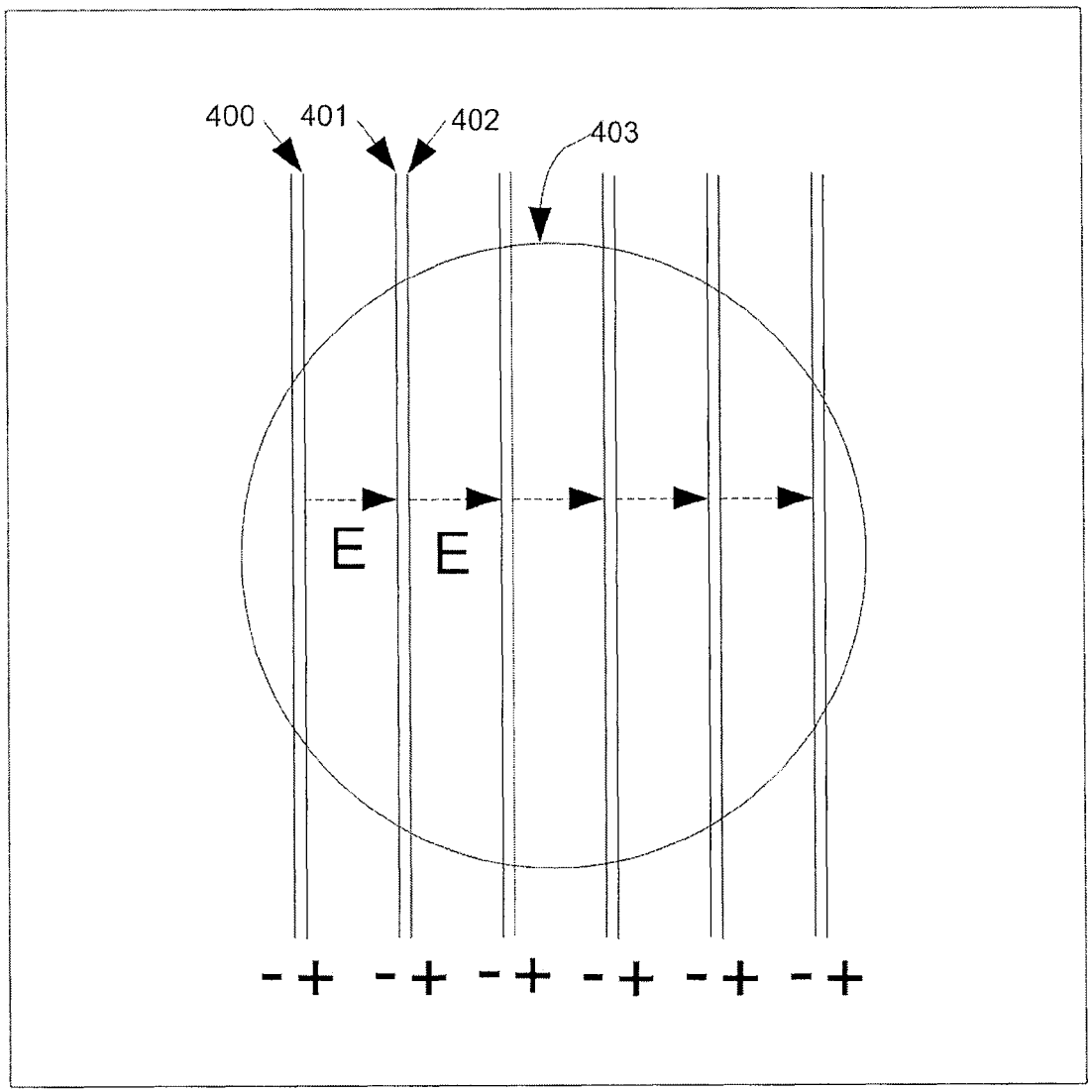
FIG. 8 illustrates one embodiment of a directional multi-plate electrode design of the present invention.

FIG. 8 illustrates an alternative multi-plate arrangement. Again multiple plates are arranged across the diameter of magnetic loop 403. Alternate plates are driven in anti-phase to produce the required potential difference. In this embodiment, plates which produce an E field from left to right in the cycle illustrated are widely spaced 400-401 to bound a large volume of H field while plates which produce a field in the opposite direction 401-402 are closely spaced to enclose a smaller H field region. This embodiment of the present invention produces greater antenna gain toward the bottom of the page.

Figure 9:
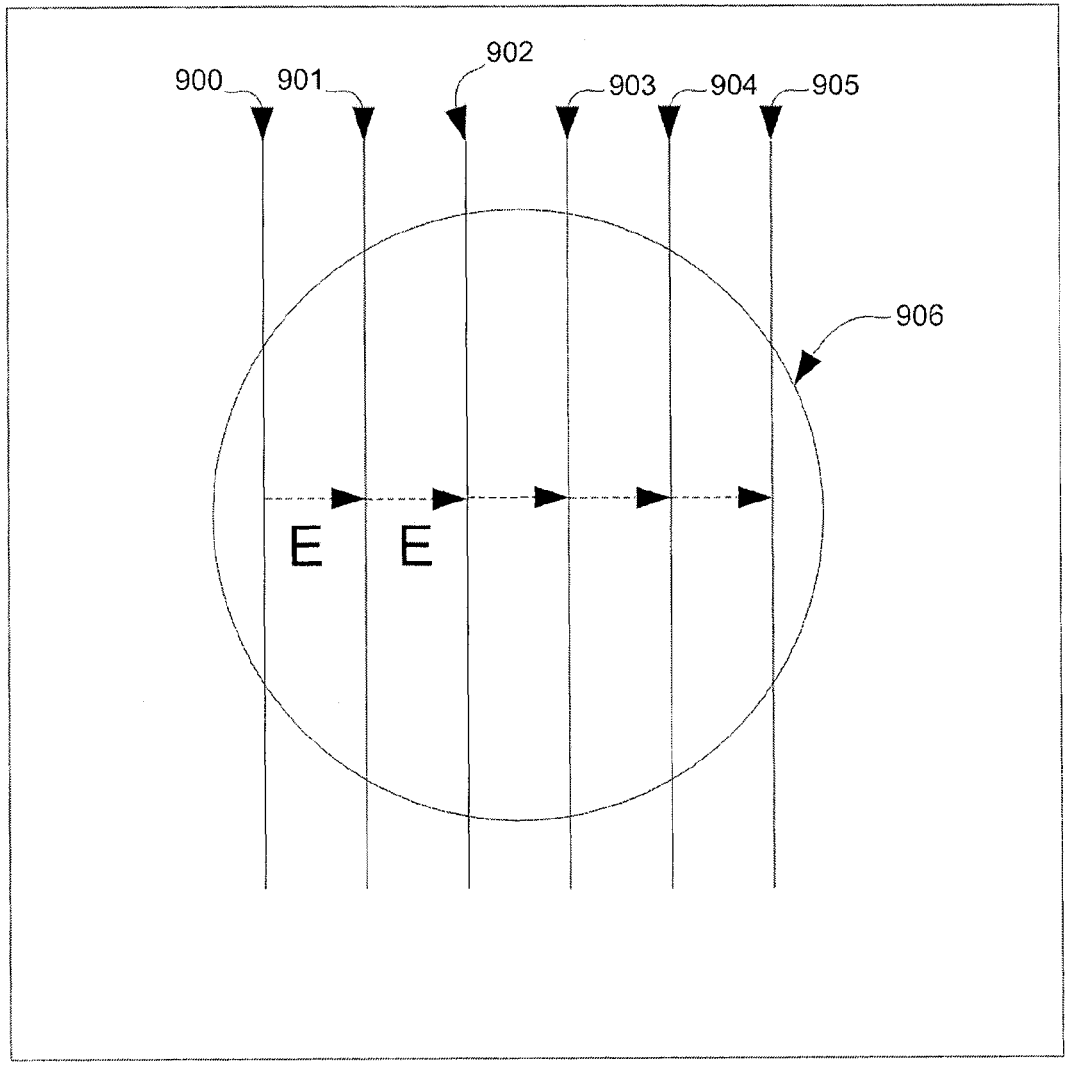
FIG. 9 illustrates one embodiment of an alternative multi-plate electrode design of the present invention that generates a constant E field across the loop.

Referring now to FIG. 9, another embodiment is illustrated of evenly spaced plates. In this embodiment, balanced drivers are connected across adjacent plates 900 to 905 to create a potential with respect to the adjacent plate so generating a constant potential gradient across the loop 906.

In certain embodiments, it is necessary to electrically insulate E field plates for operation in a partially conductive medium.

The electric field is then orthogonal to the potential gradient and is defined as:—

$$E = V/d \quad (3)$$

Where:—

E=Electric field

V=potential difference between plates d=distance between plates

It will be appreciated that the antenna system of the present invention can be utilized in communication as well as other transmit and/or receive systems. The antenna system of the present invention can be used in navigation systems, direction finding systems, systems for detecting the presence of objects and the like. It will be appreciated that the antenna system of the present invention can be used in a variety of different mediums including but not limited to, air, seawater, fresh water, brackish water, through ground signalling and the like.

While the invention has been described and illustrated with reference to certain particular embodiments thereof, those skilled in the art will appreciate that various adaptations, changes, modifications, substitutions, deletions, or additions of procedures and protocols may be made without departing from the spirit and scope of the invention. Expected variations or differences in the results are contemplated in accordance with the objects and practices of the present invention. It is intended, therefore, that the invention be defined by the scope of the claims which follow and that such claims be interpreted as broadly as is reasonable.

What is claimed is:

1. An antenna system for transmitting an electromagnetic signal through a medium, comprising:
   a loop antenna with a loop current and including:
   an E field transducer that generates an E field;
   an H field transducer that generates an H field, wherein the E and H fields are orthogonal in space and have at least one of a magnitude and phase relationship that is matched to an intrinsic impedance of a medium to generate a propagating wave,
   wherein in an insulating medium the loop current lags an E field plate voltage by 90° to produce in phase E and H fields, and in a conductive medium current is applied to the loop with a 135° phase lag with respect to a voltage across the E field plates, the H field is generated by the current component and leads current by 90°.

2. The system of claim 1, wherein the H transducer is a parallel plate transducer that is co-located with a loop or solenoid for H field.

3. The system of claim 1, wherein in the conductive medium is water and the E and H fields are combined such that they have at least one of, a magnitude and phase relationship that is matched to the intrinsic impedance of the water.

4. The system of claim 1, wherein the E field transducer has a pair of parallel conducting plates.

5. The system of claim 4, wherein the parallel plates are arranged at either side of the H field transducer.

6. The system of claim 5, wherein multiple pairs of parallel plates are provided.

7. The system of claim 6, wherein each of a plate is driven with an in-phase voltage referenced to an adjacent plate that creates a constant E field vector across the loop.

8. The system of claim 6, wherein each of an adjacent pair of parallel plates is driven with anti-phase voltage.

9. The system of claim 6, wherein multiple the parallel plates are equally spaced.

10. The system of claim 6, wherein the parallel plates are alternately closely and widely spaced.

11. The system of claim 6, wherein at least one pair of parallel plates is in the H field transducer.

12. The system of claim 1, wherein the E field transducer is covered by an electrically insulating material.

13. The system of claim 1, wherein the H field transducer includes at least one magnetic dipole.

14. The system of claim 1, wherein at least two magnetic dipoles are provided in a Helmholtz coil arrangement.

15. The system of claim 14, wherein multiple dipoles are provided that are each operable to be independently driven.

16. The system of claim 1, wherein the H field transducer is an open cored solenoid.

17. The system of claim 1, wherein the H field transducer has a magnetic field that is substantially uniform in magnitude and direction throughout its volume.

18. The system of claim 1, wherein when the H field transducer has one or more loops volume is defined by the loop or loops.

19. The system of claim 1, wherein an electric field of the E field transducer is substantially uniform in magnitude and direction.

20. The system of claim 1, wherein when the E field transducer includes parallel plates the electric field is substantially uniform in magnitude and direction in a region between the plates.

21. The system of claim 1, wherein the E-field transducer includes a pair of conducting plates arranged at either side of a Helmholtz coil magnetic transducer with a dimension of at least twice a loop radius in a direction of a loop plane, and at least equal to the loop radius in a direction of loop separation, and positioned to generate a substantially uniform E field throughout a volume bounded by the two loops.

22. The system of claim 1, further comprising:
an apparatus for measuring a propagation medium conductivity and providing for adjustment of at least one of magnitude and phase relationship between the E and H fields in response to a measured conductivity.

* * * * *